(12) United States Patent
Vaassen

(10) Patent No.: US 7,827,511 B2
(45) Date of Patent: Nov. 2, 2010

(54) POWER DISTRIBUTION NETWORK OF AN INTEGRATED CIRCUIT

(75) Inventor: Adrianus W. P. G. G. Vaassen, Eindhoven (NL)

(73) Assignee: NXP B.V., Eindhoven (NL)

( * ) Notice: Subject to any disclaimer, the term of this patent is extended or adjusted under 35 U.S.C. 154(b) by 334 days.

(21) Appl. No.: 10/559,913

(22) PCT Filed: Jun. 1, 2004

(86) PCT No.: PCT/IB2004/050814

§ 371 (c)(1), (2), (4) Date: Dec. 7, 2005

(87) PCT Pub. No.: WO2004/109799

PCT Pub. Date: Dec. 16, 2004

(65) Prior Publication Data

US 2006/0175636 A1 Aug. 10, 2006

(30) Foreign Application Priority Data

Jun. 11, 2003 (EP) .................................. 03101700

(51) Int. Cl.
*G06F 17/50* (2006.01)

(52) U.S. Cl. ................. 716/7; 716/8; 716/9; 716/10; 716/11; 716/12

(58) Field of Classification Search ................ 716/1–2, 716/7–13
See application file for complete search history.

(56) References Cited

U.S. PATENT DOCUMENTS

| | | | | |
|---|---|---|---|---|
| 4,612,618 A * | 9/1986 | Pryor et al. | | 716/10 |
| 4,748,494 A | 5/1988 | Yamada et al. | | |
| 4,978,633 A * | 12/1990 | Seefeldt et al. | | 438/113 |
| 5,537,328 A * | 7/1996 | Ito | | 716/1 |
| 5,656,834 A * | 8/1997 | Grzyb et al. | | 257/207 |
| 6,370,678 B1 * | 4/2002 | Culler | | 716/18 |
| 6,618,847 B1 * | 9/2003 | Hulse et al. | | 716/8 |
| 7,047,515 B1 * | 5/2006 | Vitek et al. | | 716/15 |
| 7,272,803 B1 * | 9/2007 | Hsu | | 716/2 |
| 2001/0039643 A1 * | 11/2001 | Kuroda et al. | | 716/11 |
| 2002/0093036 A1 * | 7/2002 | Aggarwal et al. | | 257/208 |
| 2004/0031007 A1 * | 2/2004 | Hirakimoto et al. | | 716/8 |
| 2004/0073881 A1 * | 4/2004 | Nassif et al. | | 716/10 |

* cited by examiner

*Primary Examiner*—Paul Dinh

(57) ABSTRACT

An integrated circuit (51) comprises a power distribution network having a power pad (53) and a ground pad (55) arranged at diagonally opposite corners of the integrated circuit (51). A power bus (67, 69) and a ground bus (71, 73) supply power to circuit elements on the integrated circuit, for example standard cells (61a, 61b) or standard sub-blocks (63). A plurality of decoupling cells (65) are provided on the power distribution network for maintaining a static current flow between the power pad (53) and the ground pad (55). The power bus and ground bus are configured such that the combined length of the power bus and the ground bus is made the same for all circuit elements on the integrated circuit, thereby reducing on chip voltage variation.

20 Claims, 2 Drawing Sheets

POWER DISTRIBUTION NETWORK OF AN INTEGRATED CIRCUIT

The present invention relates to an integrated circuit, and in particular, to an integrated circuit having a power distribution network for reducing on chip voltage variation between various locations on the integrated circuit.

An integrated circuit comprises a power distribution network for delivering power to the various circuit elements provided on the chip. A power distribution network comprises a power bus and a ground bus, the power bus supplying power to the circuit elements, and the ground bus sinking power therefrom.

The design of an integrated circuit usually assumes an ideal power supply that can instantly deliver any amount of current to maintain a specified voltage throughout the chip. In reality, however, integrated circuits suffer from the disadvantage that different locations on the integrated circuit have different voltage levels. The variation in voltage levels on an integrated circuit results from current flowing through resistive elements, commonly referred to as "IR drops". The voltage at any given location on the integrated circuit suffers from an IR drop in both the power bus and the ground bus of the power distribution network, and the amount of voltage drop depends on the effective resistance from the power and ground pads to a respective location on the integrated circuit With the ever increasing desire to maximize the density of integrated circuit design, it follows that narrower metal line widths lead to an increase in resistance, and therefore an increase in the amount of voltage drop in the integrated circuit.

FIG. 1 shows a typical power distribution network for an integrated circuit, in which a power supply 1 is connected to a power pad 3 and a ground pad 5. The power distribution network comprises a power bus 7 and a ground bus 9 for supplying power ($V_{power}$) to the circuit elements of the integrated circuit. The resistance of each section of the power bus is represented as resistive elements 11, 12, 13, 14, having resistance values R11, R12, R13 and R14, respectively. Likewise, the resistance of each section of the ground bus 9 is represented as resistive elements 21, 22, 23, 24, having resistance values R21, R22, R23 and R24, respectively. The power bus 7 and ground bus 9 are shown as supplying power to circuit elements in the form of logic gates 31, 32, 33, 34.

It can be seen that the effective resistance between each logic gate 31, 32, 33, 34 and the power and ground pads 3, 5 is different For example, power is supplied to the logic gate 31 by a section of the power bus 7 having a resistance R11, and a section of the ground bus 9 having a resistance R21. In contrast, power is supplied to the logic gate 33 by a section of the power bus having a resistance corresponding to R11+R12+R13, and a section of the ground bus having a resistance corresponding to R21+R22+R23.

This difference in resistance results in different voltages $V1_P$ to $V4_P$ being provided at the power pin of the logic gates 31, 32, 33, 34, respectively. For example, the voltage $V2_P$ at logic gate 32 does not have an ideal supply voltage VDD at its power pin, since this voltage is decreased by the cumulative effect of resistances R11 and R12 along the power bus 7.

Similarly, the IR drop on the ground bus 9 effectively increases the ground voltages $V1_G$ to $V4_G$ at logic gates 31, 32, 33, 34, respectively. The net result is that each logic gate 31, 32, 33, 34 will have a different individual voltage supply. For example, the voltage supply across logic gate 32 will be less than the voltage supply across logic gate 31. Similarly, the voltages across logic gates 33 and 34 are decreased further due to the fact that they are situated further away from the power and ground pads 3, 5, thereby having greater IR drops.

The variation in voltage supply can change the delay characteristics of certain basic structures in the integrated circuit, which can lead to one logic gate having a different delay to another. This variation in delays can lead to on chip timing problems.

U.S. Pat. No. 4,748,494 shows a known method of reducing voltage variation on an integrated circuit. The solution proposed in U.S. Pat. No. 4,748,494 has the disadvantage of requiring a plurality of separate power busses, and dividing circuit elements into groups of circuit elements, each group having a dedicated bias circuits.

The aim of the present invention is to provide an integrated circuit having a power distribution network which reduces on chip voltage variation between various locations on the integrated circuit, without having the disadvantages mentioned above.

According to the present invention, there is provided an integrated circuit having a power distribution network, the power distribution network comprising a power bus and a ground bus for supplying power from respective power and ground pads to a plurality of circuit elements on the integrated circuit, characterized in that the power distribution network comprises a plurality of decoupling cells for providing a static current flow between the power pad and the ground pad, and wherein the power distribution network is configured such that, for any given circuit element on the integrated circuit, the combined distance between the power pad and said circuit element, and between the ground pad and said circuit element, is constant.

For a better understanding of the present invention, and to show more clearly how it may be carried into effect, reference will now be made, by way of example, to the accompanying drawings, in which:

FIG. 2 shows one branch of a typical power distribution network as previously discussed in FIG. 1. The voltage drop for one branch of the power distribution network is analyzed in view of the other branches being decoupled from the rest of the power distribution network The following equations are valid for this analysis:

$$V_{G1} = V_{power} - \Delta V$$

$$\Delta V = V_{R11} + V_{R21}$$

$$V_{R11} = I_1 \cdot R_{11}$$

$$R = \frac{l \cdot \rho}{A}$$

$$\Delta V \propto l_{R11} + l_{R21}$$

$$l_{R11} = \Delta x + \Delta y$$

where $V_{G1}$ is the voltage across logic gate 31, $V_{power}$ is the supply power 1, $\Delta V$ is the voltage drop, R11/R12 the resistances of the power bus and ground bus, respectively, and $\Delta x$ and $\Delta y$ the lengths of the power and ground lines.

It can be seen from the above that, for each point on the chip, the voltage drop is dependent on the length of the wires from the power pad 3 (i.e. the VDD pad) to the ground pad 5 (i.e. the VSS pad).

Figure 1:
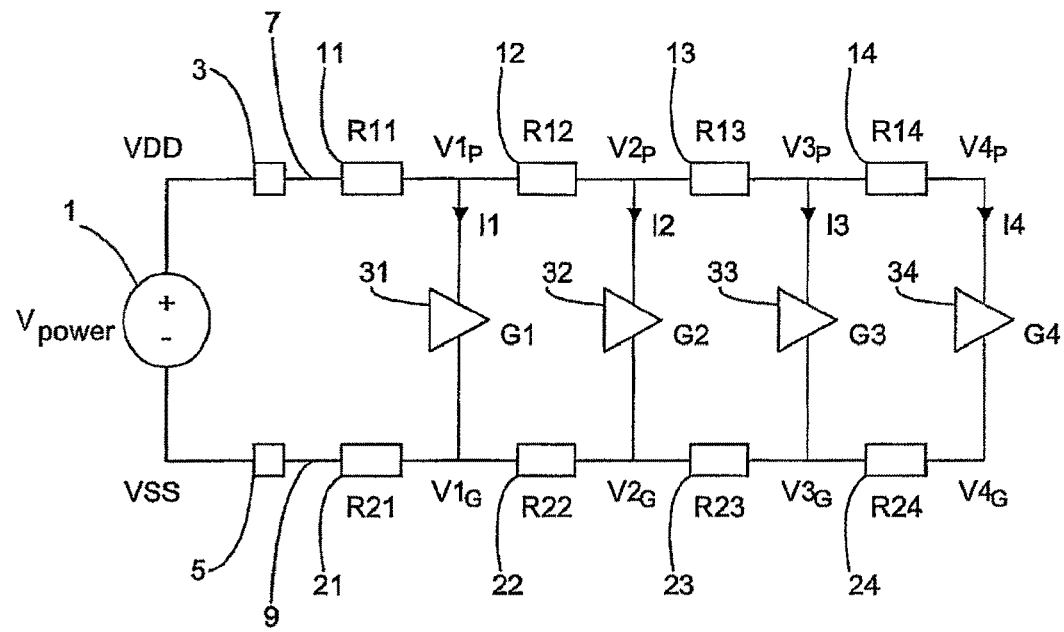
FIG. 1 shows a typical power distribution network for an integrated circuit.
Figure 2:
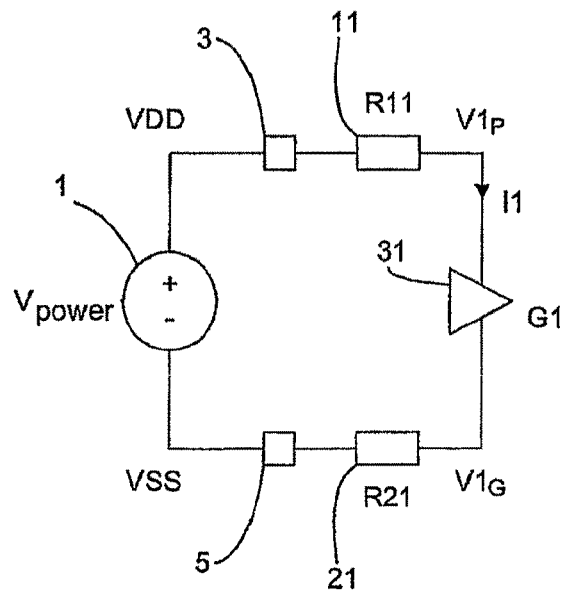
FIG. 2 shows part of the power distribution network of FIG. 1.

Therefore, for a conventional power distribution network as shown in FIG. 1, the voltage drop will be different for different locations on the integrated circuit, resulting in a different voltage being made available at each logic gate 31, 32, 33, 34.

Figure 3:
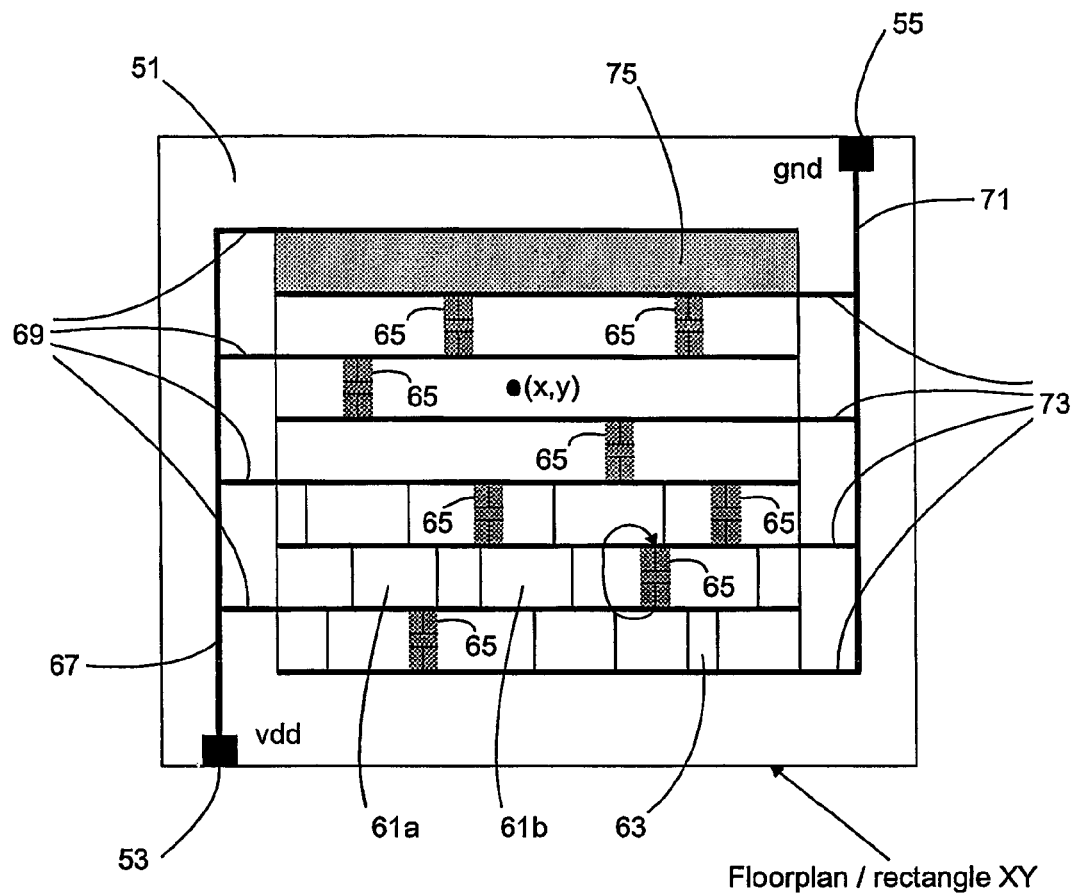
FIG. 3 shows a power distribution network according to a preferred embodiment of the present invention.

FIG. 3 shows an integrated circuit 51 having a power distribution network according to the present invention. The power distribution network comprises a power pad 53 and a ground pad 55, which receive power from a power source (not shown). The power pad 53 and the ground pad 55 are arranged at diagonally opposite corners of the integrated circuit 51. The power distribution network comprises a power bus (67, 69) and a ground bus (71, 73), which supply power to circuit elements such as standard cells 61a, 61b or standard sub-blocks 63 on the integrated circuit 51. A plurality of decoupling cells 65 are provided on the power distribution network for supplying the current required by the circuit elements, thereby maintaining a static current flow between the power pad 53 and the ground pad 55.

The power bus comprises a vertical section 67 connected to the power pad 53. The vertical section 67 comprises one or more horizontal sections 69 for supplying power to the various circuit elements. In a similar manner, the ground bus comprises a vertical section 71 connected to the ground pad 55, having one or more horizontal sections 73 for sinking power from the various circuit elements. The horizontal sections 69 of the power bus are interleaved with the horizontal sections 73 of the ground bus to form rows 75. The circuit elements are arranged within the rows 75 such that the power bus is connected to one side of a circuit element and the ground bus at the other.

The power distribution network is configured such that the voltage drop between the power supply and each circuit element is constant, thereby resulting in all circuit elements being influenced by the same voltage.

This is achieved by the manner in which the combined length of the power bus and the ground bus is made the same for all gates on the integrated circuit. In other words, as the distance from the power pad 53 increases, the distance from the ground pad 55 decreases by a complementary amount. Thus, for any point X,Y on the integrated circuit, the total length of power bus (67, 69) and ground bus (71, 73) is constant.

Since the power bus and the ground bus comprise horizontal and vertical sections, the present invention transforms the problem to the equation shown below. To achieve the same voltage drop, AV, over the entire integrated circuit, all the individual sections of distances from the power pad 53 and ground pad 55 to a possible coordinate, XY, within a rectangle XY should be, in total, constant.

Thus, $$(x_{vdd} - x_{G1}) + (y_{vdd} - y_{G1}) + (x_{vss} - x_{G1}) + (y_{vss} - y_{G1}) = \text{const}$$
given rectangle XY According to the invention, the power and ground points are placed at diagonally opposite corners of a rectangle XY. The power distribution to the various cells is arranged in an interleaving fork structure such that the power and ground per row is fixed. This results in the X or Y part being fixed. This also means that, when looking at the floor plan of the integrated circuit, the power is connected at one side and the ground connected at the other side. These connections are then expanded to opposite corners of the rectangle XY.

The invention provides a power distribution network in which all the circuit elements or gates have the same total distance from the cell to the supply pads. Since each cell has the same total distance from the cell to the supply pads, it follows that each cell has a constant voltage drop, which results in less variation in the on chip voltage.

Preferably, the decoupling cells 65 of the power distribution network are decoupling capacitors which provide most, if not all, of the dynamic current drawn by the circuit elements. The use of decoupling cells 65 enables a static current to be provided between the power pad 53 and ground pad 55. The decoupling cells are preferably the same height as the other standard cells on the integrated circuit, thus enabling the decoupling cells 65 to be placed automatically between the circuit elements. It is noted that certain circuit elements, for example flip flop gates, already have capacitance within the standard cell, and do not therefore require an additional decoupling cell 65. The area cost of the decoupling cells is not high because placement area is not usually as critical as routing area.

The use of the decoupling capacitors 65, together with the power distribution structure described above, provides an integrated circuit in which on chip voltage variation is reduced.

Although FIG. 3 shows the application of the power distribution network to a given rectangular section of integrated circuit, it is noted that the fork structure can also be used on a hierarchical basis. In other words, a smaller fork structure can be used at a particular location, such that power is distributed within that particular location using a similar power distribution network. This results in a power distribution system having less on chip voltage variation over the entire integrated circuit.

It is noted that, although the preferred embodiment is described using an interleaved fork structure comprising horizontal and vertical sections, it will be readily apparent to a person skilled in the art that other structures can be used which provide the desired effect, for example a power distribution system arranged as an oblique parallelogram or rhombic type structure, such that each coordinate on the integrated circuit has the same total distance to the power and ground supply pins. Also, it is noted that the power distribution network can be varied in other ways, provided that the required symmetry is maintained. Furthermore, although the power distribution network shows the power bus and ground bus having constant widths, these can be varied provided that symmetry is maintained. For example, the vertical section 67 could be wider than the horizontal sections 69 in the power bus, provided that the ground bus has a similar vertical section 71, which is wider than the horizontal sections 73.

Other modifications within the scope of the appended claims will be apparent to those skilled in the art.

The invention claimed is:

1. An integrated circuit having a power distribution network, the power distribution network comprising:
    a power bus and a ground bus for supplying power from respective power and ground pads to a plurality of circuit elements on the integrated circuit; and
    a plurality of decoupling cells for providing a static current flow between the power pad and the ground pad, and wherein the power distribution network is configured such that each given circuit element on the integrated circuit is arranged with a combined distance equal to a sum of a length of the power bus connected between the power pad and said circuit element plus a length of the ground bus connected between the ground pad and said circuit element, and each of the combined distances being equal.

2. An integrated circuit as claimed in claim 1, wherein the combined distances are equal for predominantly all of the circuit elements in the integrated circuit.

3. An integrated circuit as claimed in claim 1, wherein the power pad and the ground pad are arranged at diagonally opposite corners of the integrated circuit.

4. An integrated circuit as claimed in claim 1, wherein the power distribution network comprises:
   a power bus comprising a vertical section connected to the power pad, and one or more horizontal sections connected to the vertical section;
   a ground bus comprising a vertical section connected to the ground pad and one or more horizontal sections connected to the vertical section;
   wherein the vertical section of the power bus is arranged parallel to the vertical section of the ground bus, such that the one or more horizontal sections of the power bus interleave the one or more horizontal sections of the ground bus; and
   wherein one of the circuit elements is connected between horizontal sections of the power bus and ground bus and arranged with said combined distance that is equal to said combined distance for another one of the circuit elements that is connected between different horizontal sections of the power bus and ground bus.

5. An integrated circuit as claimed in claim 4, wherein a horizontal section of the power bus and a horizontal section of a ground bus form a row for powering one or more of the circuit elements.

6. An integrated circuit as claimed in claim 5, wherein one or more circuit elements are located between the horizontal section of the power bus and the horizontal section of the ground bus.

7. An integrated circuit as claimed in claim 1, wherein the decoupling cells include decoupling capacitors.

8. An integrated circuit as claimed in claim 7, wherein the decoupling cells are configured to be the same height as the circuit elements.

9. An integrated circuit as claimed in claim 8, wherein the decoupling cells are arranged between circuit elements on the integrated circuit.

10. An integrated circuit as claimed in claim 1, wherein the power distribution network comprises one or more smaller power distribution networks having the same configuration.

11. An integrated circuit as claimed in claim 1, wherein the power distribution network is configured to maintain the voltage drop between the power pad and each circuit element constant, relative to the voltage drop for predominantly all of the circuit elements in the integrated circuit.

12. An integrated circuit as claimed in claim 1, wherein the decoupling cells are configured to maintain the voltage drop between the power pad and each circuit element constant, relative to the voltage drop for predominantly all of the circuit elements in the integrated circuit.

13. An integrated circuit as claimed in claim 1, wherein the decoupling cells are configured to selectively couple each of said given circuit elements to maintain combined distance constant among predominantly all of the circuit elements.

14. An integrated circuit as claimed in claim 1, wherein a plurality of the decoupling cells are arranged to provide current flow to a particular one of the circuit elements and therein partly defining the combined distance for the particular one of the circuit elements.

15. An integrated circuit as claimed in claim 1, wherein at least one of the decoupling cells is arranged to provide current flow to at least two of the circuit elements and therein partly defining the combined distance for the at least two of the circuit elements.

16. For supplying power to a plurality of circuit elements on an integrated circuit, a power distribution network comprising:
   a power pad;
   a ground pad;
   a network of conductors to connect the power pad and the ground pad to each of the plurality of circuit elements; and
   a plurality of decoupling cells for providing a static current flow between the power pad and the ground pad, and wherein each given circuit element is arranged with a combined distance equal to a sum of a length of the conductors connected between the power pad and said circuit element plus a length of the conductors connected between the ground pad and said circuit element, and each of the combined distances being equal.

17. The power distribution network of claim 16, wherein the decoupling cells maintain the constant combined distance for a circuit element by connecting the conductors to the circuit element to decrease the distance between the circuit element and one of the power pad and the ground pad in a manner that is complementary to an increased distance between the circuit element and the other one of the power pad and the ground pad.

18. The power distribution network of claim 16, wherein the decoupling cells maintain the constant combined distance for a circuit element by connecting the conductors to the circuit element to increase the distance between the circuit element and one of the power pad and the ground pad in a manner that is complementary to a decreased distance between the circuit element and the other one of the power pad and the ground pad.

19. The power distribution network of claim 16, wherein the decoupling cells maintain a static current between the power pad and the ground pad by connecting the circuit elements via the conductors.

20. The power distribution network of claim 16, wherein a plurality of the decoupling cells are arranged to provide current flow to a particular one of the circuit elements and therein partly defining the combined distance for the particular one of the circuit elements.

* * * * *